(12) United States Patent
Kwak et al.

(10) Patent No.: US 9,093,157 B2
(45) Date of Patent: Jul. 28, 2015

(54) NONVOLATILE MEMORY DEVICE AND RELATED METHOD OF PROGRAMMING

(71) Applicants: Donghun Kwak, Hwaseong-Si (KR); Suna Kim, Suwon-Si (KR); Cheon An Lee, Hwaseong-Si (KR); Ho-Chul Lee, Seoul (KR)

(72) Inventors: Donghun Kwak, Hwaseong-Si (KR); Suna Kim, Suwon-Si (KR); Cheon An Lee, Hwaseong-Si (KR); Ho-Chul Lee, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 438 days.

(21) Appl. No.: 13/670,731

(22) Filed: Nov. 7, 2012

(65) Prior Publication Data

US 2013/0242675 A1   Sep. 19, 2013

(30) Foreign Application Priority Data

Mar. 14, 2012   (KR) .................. 10-2012-0026209

(51) Int. Cl.
  *G11C 16/10*   (2006.01)
  *G11C 8/08*    (2006.01)
  *G11C 16/04*   (2006.01)

(52) U.S. Cl.
  CPC ........ *G11C 16/10* (2013.01); *G11C 8/08* (2013.01); *G11C 16/0483* (2013.01)

(58) Field of Classification Search
  CPC ............... G11C 16/10; G11C 16/0483; G11C 11/5642; G11C 16/08; G11C 16/0416; G11C 16/26; G11C 2211/5621; G11C 8/08; G11C 16/12
  See application file for complete search history.

(56) References Cited

U.S. PATENT DOCUMENTS

| | | | |
|---|---|---|---|
| 7,619,933 B2 | 11/2009 | Sarin | |
| 2008/0273395 A1* | 11/2008 | Sarin et al. | 365/185.22 |
| 2009/0273984 A1* | 11/2009 | Tanzawa | 365/185.25 |
| 2010/0188898 A1 | 7/2010 | Sarin | |
| 2011/0128782 A1 | 6/2011 | Goda et al. | |
| 2011/0292725 A1* | 12/2011 | Choi et al. | 365/185.03 |
| 2011/0310666 A1 | 12/2011 | Miida et al. | |

FOREIGN PATENT DOCUMENTS

| | | |
|---|---|---|
| KR | 1020100119165 A | 11/2010 |
| WO | 2010125695 A1 | 11/2010 |

* cited by examiner

*Primary Examiner* — Hien Nguyen
(74) *Attorney, Agent, or Firm* — Volentine & Whitt, PLLC

(57) ABSTRACT

A three-dimensional nonvolatile memory device comprises a plurality of cell strings arranged perpendicular to a substrate. The nonvolatile memory device is programmed by identifying a selected word line and a plurality of unselected word lines connected to at least one of the cell stings, and sequentially applying a negative voltage and a pass voltage to the selected and unselected word lines, and then applying a program voltage to the selected word line while continuing to apply the pass voltage to the unselected word lines.

20 Claims, 19 Drawing Sheets

Fig. 9

| Selected BL | VCC → VSS |
|---|---|
| Unselected BL | VCC |
| Selected SSL | VCC |
| Unselected SSL | VCC → VSS |
| Selected WL | VN1 → VPASS → VPGM |
| Unselected WL | VN1 → VPASS |
| GSL | VSS |
| Substrate | VSS |

Fig. 15

| Selected BL | VCC → VSS |
|---|---|
| Unselected BL | VCC |
| Selected SSL | VCC |
| Unselected SSL | VCC → VSS |
| Selected WL | VN1 → VPASS → VPGM |
| Unselected WL | VN1 → VPASS |
| GSL | VN2 → VSS |
| Substrate | VSS |

NONVOLATILE MEMORY DEVICE AND RELATED METHOD OF PROGRAMMING

CROSS-REFERENCE TO RELATED APPLICATIONS

This application claims priority under 35 U.S.C. §119 to Korean Patent Application No. 10-2012-0026209 filed on Mar. 14, 2012, the subject matter of which is hereby incorporated by reference.

BACKGROUND OF THE INVENTION

The inventive concept relates generally to a semiconductor memory, and more particularly, to a nonvolatile memory device and a method of programming the nonvolatile memory device.

Semiconductor memory devices can be roughly classified into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM), dynamic random access memory, and synchronous DRAM (SDRAM). Examples of nonvolatile memory devices include read only memory (ROM), programmable ROM (PROM), electrically programmable ROM (EPROM), electrically erasable and programmable ROM (EEPROM), flash memory device, phase-change RAM (PRAM), magnetic RAM (MRAM), resistive RAM (RRAM), and ferroelectric RAM (FRAM).

In an effort to improve the storage capacity and performance of nonvolatile memory devices, researchers are continually seeking to increase their integration density. One recent approach to increasing integration density involves forming nonvolatile memory cells in a three-dimensional structure on a substrate. In such a structure, multiple memory cells are typically stacked in a direction perpendicular to the substrate. The development of such structures presents many technical challenges that can affect both device performance and manufacture. Accordingly, researchers continue to devote substantial resources to develop improved three-dimensional nonvolatile memory devices.

SUMMARY OF THE INVENTION

In one embodiment of the inventive concept, a method is provided for programming a nonvolatile memory device comprising a plurality of cell strings formed on a substrate, each of the cell strings comprising at least one ground selection transistor, a plurality of memory cells, and at least one string selection transistor stacked in a direction perpendicular to the substrate. The method comprises applying a negative voltage to a selected word line connected to a selected memory cell in one of the cell strings and to unselected word lines connected to unselected memory cells in the one of the cell strings, applying a pass voltage to the selected and unselected word lines after applying the negative voltage to the selected and unselected word lines, and applying a program voltage to the selected word line while continuing to apply the pass voltage to the unselected word lines.

In another embodiment of the inventive concept, a nonvolatile memory device comprises a plurality of cell strings formed on a substrate, each of cell strings comprising a plurality of memory cells stacked in a direction perpendicular to the substrate, an address decoder connected to cell strings via a plurality of word lines, and a read/write circuit connected to cell strings via a plurality of bit lines. In a program operation, the address decoder is configured to apply a negative voltage to a plurality of word lines connected to one of the cell strings and to then apply a program voltage to a selected word line among the plurality of word lines.

In yet another embodiment of the inventive concept, a method is provided for programming a three-dimensional nonvolatile memory device comprising a plurality of cell strings arranged perpendicular to a substrate. The method comprises identifying a selected word line and a plurality of unselected word lines connected to at least one of the cell stings, and sequentially applying a negative voltage and a pass voltage to the selected and unselected word lines, and then applying a program voltage to the selected word line while continuing to apply the pass voltage to the unselected word lines.

These and other embodiments of the inventive concept may potentially improve the reliability of program operations by improving boosting efficiency according to the applied voltages.

BRIEF DESCRIPTION OF THE DRAWINGS

The drawings illustrate selected embodiments of the inventive concept. In the drawings, like reference numbers indicate like features, and the sizes and relative sizes of certain features may be exaggerated for clarity of illustration.

FIG. 9 is a table illustrating bias conditions of a memory cell array in the method of FIG. 8.

FIG. 15 is a table illustrating bias conditions of a memory cell array in the method of FIG. 14.

DETAILED DESCRIPTION

Figure 1:
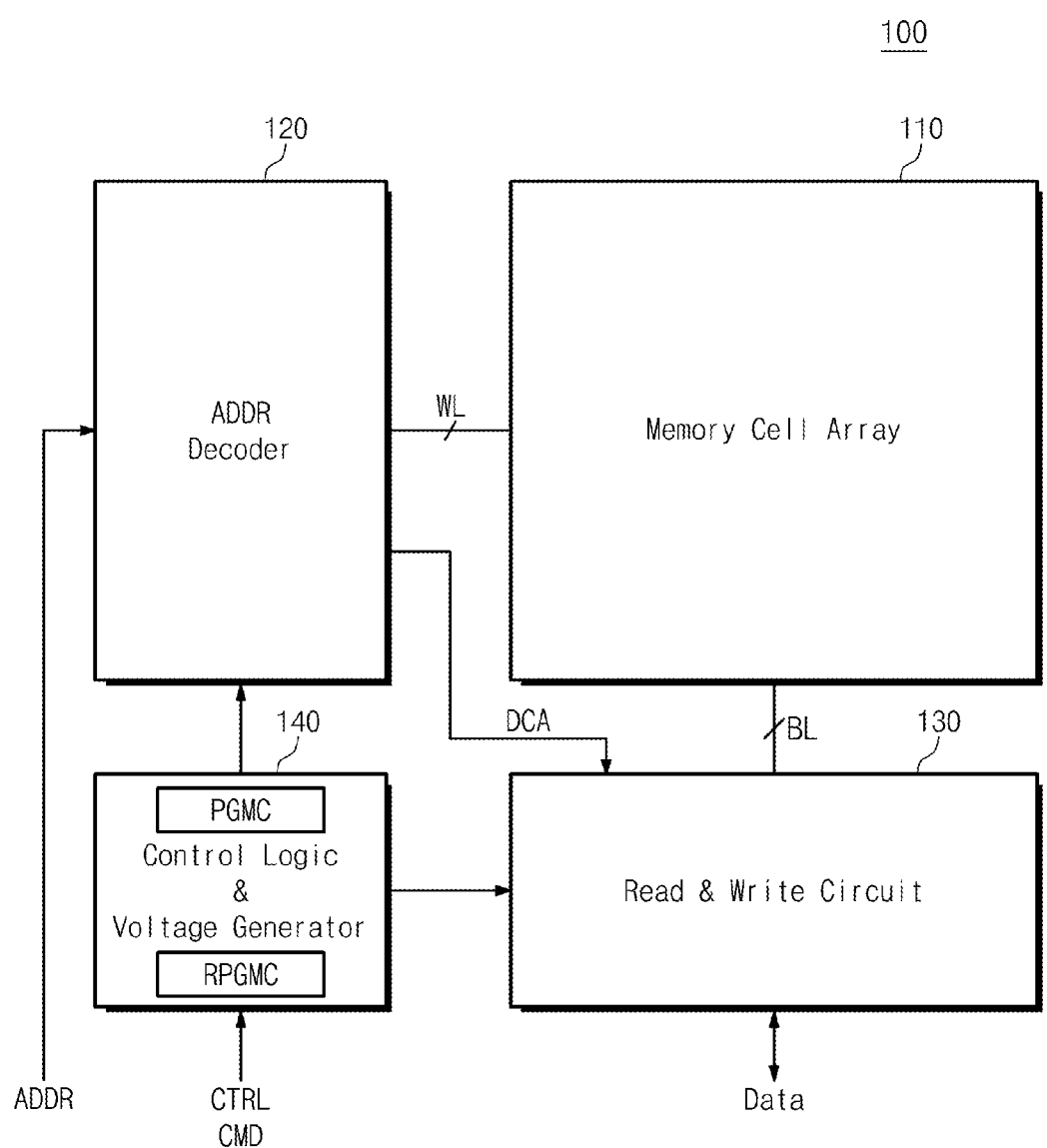
FIG. 1 is a block diagram of a nonvolatile memory device according to an embodiment of the inventive concept.

Embodiments of the inventive concept are described below with reference to the accompanying drawings. These embodiments are presented as teaching examples and should not be construed to limit the scope of the inventive concept. The following description may avoid discussion of certain known processes, elements, and techniques that are not necessary for teaching the inventive concept.

In the description that follows, the terms "first", "second", "third", etc., may be used herein to describe various features, but the described features should not be limited by these terms. Rather, these terms are used merely to distinguish between different features. Thus, a first feature could be termed a second feature and vice versa without affecting the underlying substance of the discussion.

Spatially relative terms, such as "beneath", "below", "lower", "under", "above", "upper" and the like, may be used herein for ease of description to describe one element or feature's relationship to another element(s) or feature(s) as illustrated in the drawings. The spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, where a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. Terms such as "comprises," "comprising," "includes," "including," and the like, where used in this specification, indicate the presence of stated features but do not preclude the presence or addition of other features. As used herein, the term "and/or" includes any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or this specification and will not be interpreted in an idealized or overly formal sense unless expressly so defined herein.

The term "selected memory block" may be used to indicate a memory block, selected for programming, erasing, or reading, from among a plurality of memory blocks. The term "selected sub block" may be used to indicate a sub block, selected for programming, erasing, or reading, from among a plurality of sub blocks in one memory block.

The term "selected bit line" or "selected bit lines" may indicate a bit line or bit lines connected to a cell transistor to be programmed, erased, or read from among a plurality of bit lines. The term "unselected bit line" or "unselected bit lines" may indicate a bit line or bit lines connected to a cell transistor not to be programmed, erased, or read from among a plurality of bit lines.

The term "selected string selection line" may be used to indicate a string selection line, connected with a cell string including a cell transistor to be programmed or read, from among a plurality of string selection lines. The term "unselected string selection line" or "unselected string selection lines" may be used to indicate a remaining string selection line or remaining string selection lines other than the selected string selection line from among a plurality of string selection lines. The term "selected string selection transistors" may be used to indicate string selection transistors connected with a selected string selection line. The term "unselected string selection transistors" may be used to indicate string selection transistors connected with an unselected string selection line or unselected string selection lines.

The term "selected ground selection line" may be used to indicate a ground selection line, connected with a cell string including a cell transistor to be programmed or read, among a plurality of ground selection lines. The term "unselected ground selection line" may be used to indicate a remaining ground selection line or remaining ground selection lines other than the selected ground selection line from among a plurality of ground selection lines. The term "selected ground selection transistors" may be used to indicate ground selection transistors connected with a selected ground selection line. The term "unselected ground selection transistors" may be used to indicate ground selection transistors connected with an unselected ground selection line or unselected ground selection lines.

The term "selected word line" or "selected word lines" may indicate a word line or word lines connected to a cell transistor to be programmed, erased, or read from among a plurality of word lines. The term "unselected word line" or "unselected word lines" may indicate a word line or word lines connected to a cell transistor not to be programmed, erased, or read from among a plurality of word lines.

The term "selected memory cell" or "selected memory cells" may indicate a memory cell or memory cells to be programmed, erased, or read from among a plurality of memory cells. The term "unselected memory cell" or "unselected memory cells" may indicate the remaining memory cell or memory cells of memory cells other than the selected memory cell or memory cells.

Certain embodiments are described below with reference to a NAND flash memory device. However, the inventive concept is not limited to this type of nonvolatile memory device. For example, the inventive concept can be embodied in other types of nonvolatile memory devices such as an Electrically Erasable and Programmable ROM (EEPROM), a resistive RAM (RRAM), a NOR flash memory device, a Phase-change RAM (PRAM), a Magnetic RAM (MRAM), a Ferroelectric RAM (FRAM), and the like.

FIG. 1 is a block diagram of a nonvolatile memory device 100 according to an embodiment of the inventive concept.

Referring to FIG. 1, nonvolatile memory device 100 comprises a memory cell array 110, an address decoder 120, a read/write circuit 130, and a control logic and voltage generator block 140.

Memory cell array 110 is connected to address decoder 120 via word lines and to read/write circuit 130 via bit lines. Memory cell array 110 comprises a plurality of memory cells. In some embodiments, memory cells arranged in a row direction are connected to word lines WL, and memory cells arranged in a column direction are connected to bit lines BL. For example, memory cells arranged in a column direction may form a plurality of cell groups (e.g., strings) that are connected to the bit lines, respectively. In some embodiments, memory cell array 110 comprises multiple memory cells each storing one or more bits of data.

Address decoder 120 is connected to memory cell array 110 via word lines WL. Address decoder 120 operates under the control of control logic and voltage generator block 140. Address decoder 120 receives an address ADDR from an external device.

Address decoder 120 decodes a row address of input address ADDR, and it selects word lines WL in response to the decoded row address. Address decoder 120 receives various voltages from control logic and voltage generator block 140, and it transfers the input voltages to selected and unselected word lines.

Address decoder 120 is configured to decode a column address of input address ADDR. Address decoder 120 provides the decoded column address DCA to read/write circuit 130. In some embodiments, address decoder 120 comprises a row decoder decoding a row address, a column decoder decoding a column address, and an address buffer storing input address ADDR.

Read/write circuit 130 is coupled with memory cell array 110 via bit lines BL. Read/write circuit 130 is configured to exchange data with an external device. Read/write circuit 130 operates under the control of control logic and voltage generator block 140. Read/write circuit 130 selects bit lines BL in response to the decoded column address DCA provided from address decoder 120.

In some embodiments, read/write circuit 130 receives data from an external device and writes the received data in memory cell array 110. Read/write circuit 130 reads data from memory cell array 110 and outputs it to the external device. Read/write circuit 130 may also perform a copy-back operation by reading data from the first storage area of memory cell array 110 and writing it in the second storage area of memory cell array 110.

In some embodiments, read/write circuit 130 comprises constituent elements such as a page buffer (or, a page register), a column selecting circuit, a data buffer, and the like. In certain other embodiments, read/write circuit 130 comprises constituent elements such as a sense amplifier, a write driver, a column selecting circuit, a data buffer, and the like.

Control logic and voltage generator block 140 is coupled with address decoder 120 and read/write circuit 130. Control logic and voltage generator block 140 is configured to generate various voltages of nonvolatile memory device 100. Control logic and voltage generator block 140 operates responsive to a control signal CTRL and a command CMD from the external device.

Control logic and voltage generator block 140 comprises a program controller PGMC and a preliminary program controller RPGMC. Preliminary program controller RPGMC controls a preliminary program operation for performing a program operation. Program controller PGMC controls a program operation following the preliminary program operation.

Figure 2:
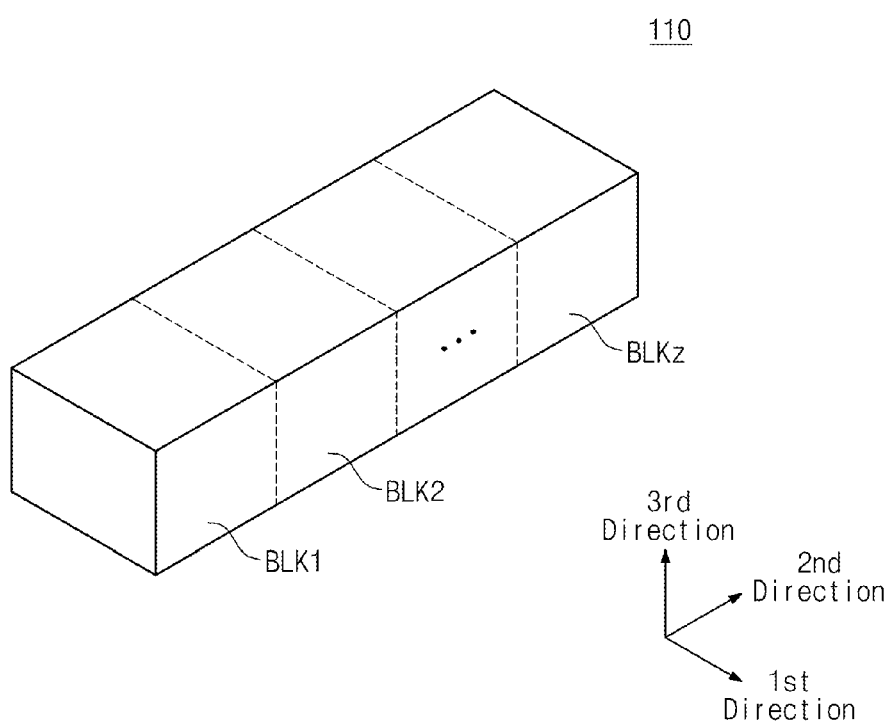
FIG. 2 is a diagram illustrating a memory cell array in FIG. 1 according to an embodiment of the inventive concept.

FIG. 2 is a diagram illustrating memory cell array 110 according to an embodiment of the inventive concept.

Referring to FIGS. 1 and 2, memory cell array 110 comprises a plurality of memory blocks BLK1 to BLKz each formed to have a three-dimensional structure (or, a vertical structure). For example, each of memory blocks BLK1 to BLKz may comprise structures extending along first to third directions. Although not shown in FIG. 2, each of memory blocks BLK1 to BLKz comprises a plurality of cell strings extending along the second direction. Although not shown in FIG. 2, a plurality of cell strings may be spaced apart from one other along the first and third directions.

Cell strings (not shown) within one memory block are coupled with a plurality of bit lines BL, a plurality of string selection lines SSL, a plurality of word lines WL, one or more ground selection lines GSL, and a common source line. Cell strings in memory blocks BLK1 to BLKz share a plurality of bit lines. For example, bit lines may extend along the second direction so as to be shared by memory blocks BLK1 to BLKz.

Memory blocks BLK1 to BLKz are selected by an address decoder 120 in FIG. 1. For example, address decoder 120 may select, from among memory blocks BLK1 to BLKz, a memory block corresponding to input address ADDR. Erasing, programming, and reading on a selected memory block may be made. Examples of memory blocks BLK1 to BLKz are described below with reference to FIGS. 3 to 6.

Figure 3:
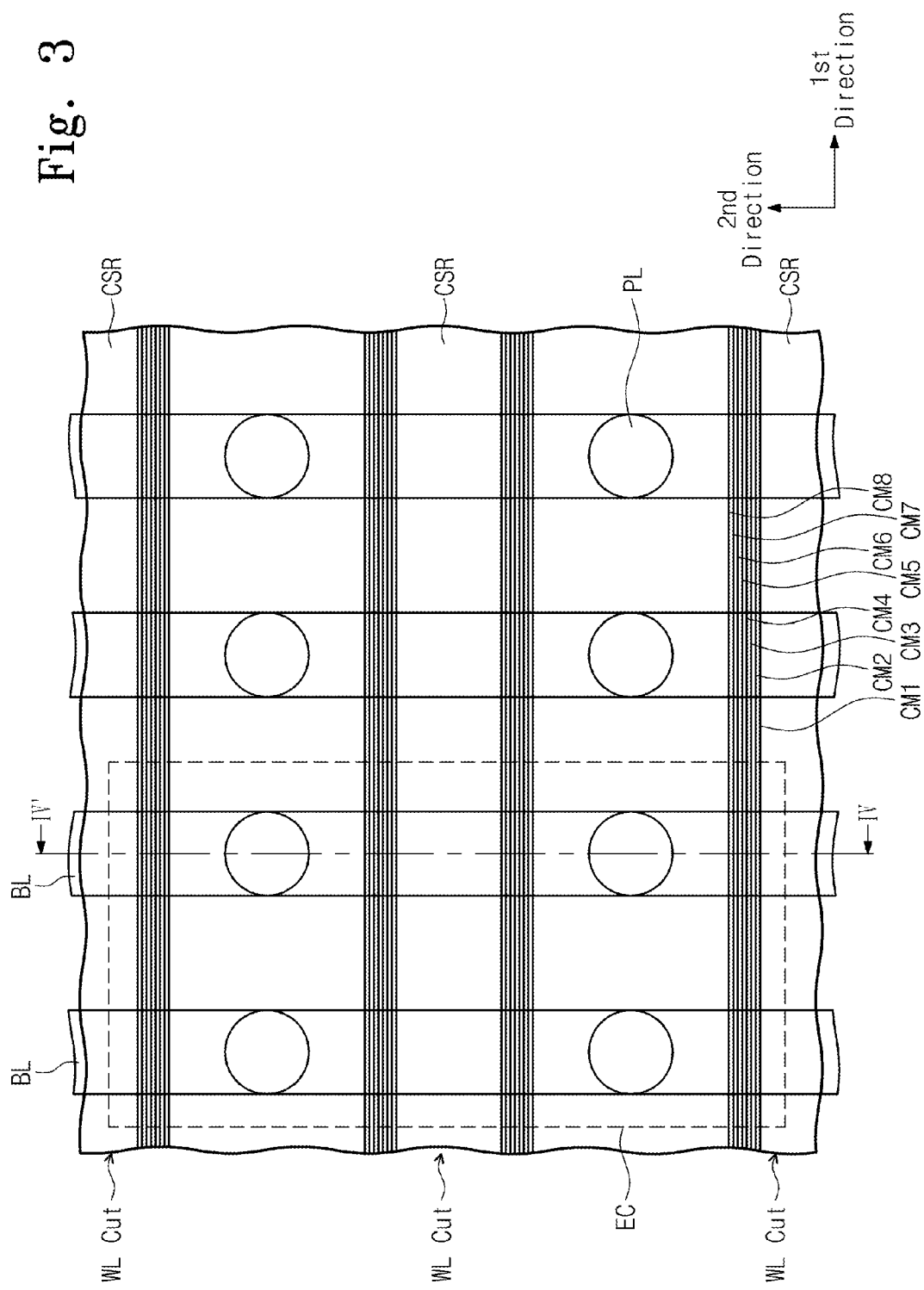
FIG. 3 is a top view of a part of one memory block in FIG. 1 according to an embodiment of the inventive concept.
Figure 4:
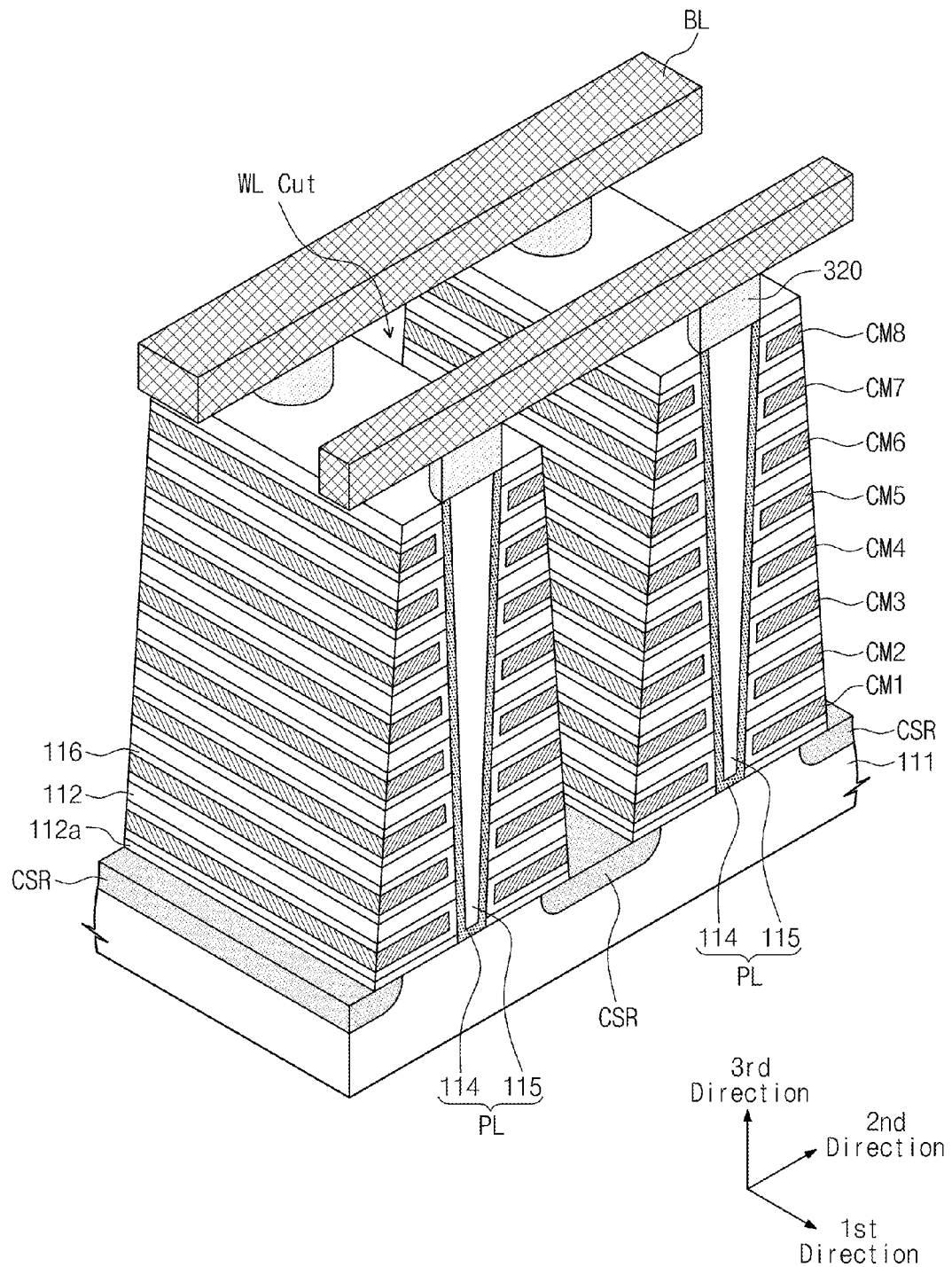
FIG. 4 is a perspective view taken along a line IV-IV' in FIG. 3 according to an embodiment of the inventive concept.
Figure 5:
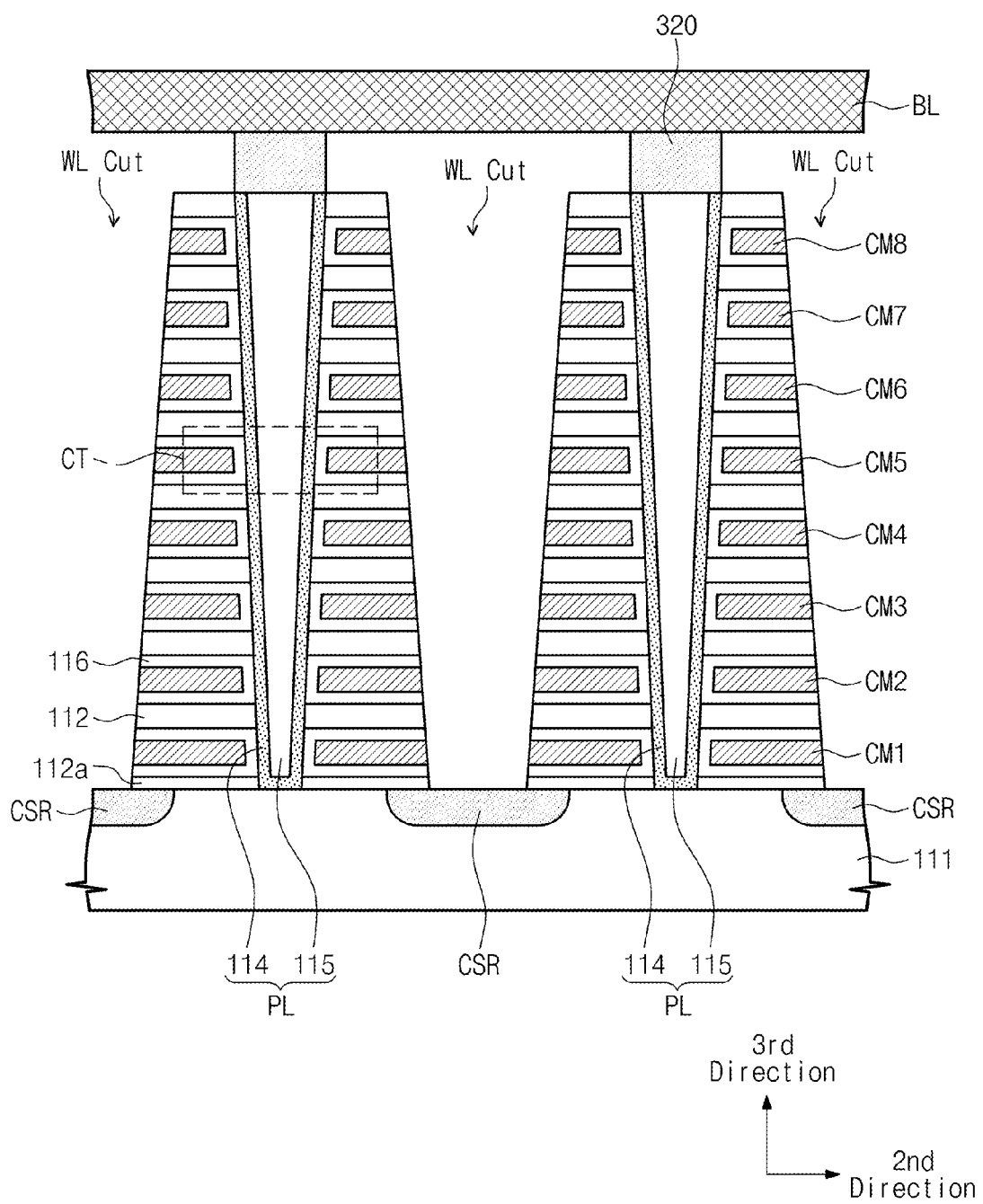
FIG. 5 is a cross-sectional view taken along the line IV-IV' in FIG. 3 according to an embodiment of the inventive concept.

FIG. 3 is a top view of a part of one memory block in FIG. 1 according to an embodiment of the inventive concept. FIG. 4 is a perspective view taken along a line IV-IV' in FIG. 3 according to an embodiment of the inventive concept. FIG. 5 is a cross-sectional view taken along the line IV-IV' in FIG. 3 according to an embodiment of the inventive concept.

Referring to FIGS. 3 to 5, three-dimensional structures extend along first to third directions above a substrate 111. Substrate 111 typically comprises a well having a first conductivity type. For example, substrate 111 may be a p-well in which Group III element such as boron is injected, or substrate 111 may be a pocket p-well which is provided within an n-well. In the description that follows, it is assumed that substrate 111 is a p-well (or, a pocket p-well). However, substrate 111 is not limited to p-type.

A plurality of common source regions CSR extending along the first direction are provided in substrate 111. Common source regions CSR are spaced apart from one another along the second direction. Common source regions CSR are connected in common to form a common source line.

Common source regions CSR typically have a second conductivity type different from that of substrate 111. For example, common source regions CSR may be n-type. In the description that follows, it is assumed that common source regions CSR are the n-type. However, common source regions CSR are not limited to the n-type.

Between two adjacent regions of common source regions CSR, insulation materials 112 and 112a are provided sequentially on substrate 111 along the third direction (i.e., a direction perpendicular to substrate 111). Insulation materials 112 and 112a are spaced apart along the third direction. Insulation materials 112 and 112a extend along the first direction. For example, insulation materials 112 and 112a comprise an insulation material such as a semiconductor oxide film. Insulation material 112a contacting with substrate 111 is thinner in thickness than other insulation materials 112.

Between two adjacent regions of common source regions CSR, pillars PL are arranged sequentially along the first direction so as to penetrate insulation materials 112 and 112a along the second direction. For example, pillars PL may contact with substrate 111 through insulation materials 112 and 112a.

In some embodiments, pillars PL between two adjacent common source regions CSR are spaced apart along the first direction. Pillars PL may also be disposed in line along the first direction.

In some embodiments, pillars PL are formed of a plurality of materials. For instance, in the embodiment of FIG. 5, each of pillars PL comprises a channel film 114 and an inner material 115 provided within channel film 114.

Channel films 114 comprise a semiconductor material (e.g., silicon) having a first conductivity type. For example, channel films 114 may include a semiconductor material (e.g., silicon) having the same type as substrate 111. Channel films 114 can include intrinsic semiconductor being a non-conductor.

Inner materials 115 comprise an insulation material. For example, inner materials 115 may be formed of silicon oxide. Alternatively, inner materials 115 may include air gap.

Between two adjacent regions of common source regions CSR, information storage films 116 are provided on exposed surfaces of insulation materials 112 and 112a and pillars PL. Information storage films 116 may store information by trapping or discharging charges.

Between two adjacent common source regions CSR and between insulation materials 112 and 112a, conductive materials CM1 to CM8 are provided on exposed surfaces of information storage films 116. Conductive materials CM1 to CM8 extend along the first direction. Conductive materials CM1 to CM8 on common source regions CSR are separated by word line cuts. Common source regions CSR may be exposed by the word line cuts. The word line cuts may extend along the first direction.

In some embodiments, conductive materials CM1 to CM8 comprise a metallic conductive material. Conductive materials CM1 to CM8 may include a nonmetallic conductive material such as polysilicon.

In some embodiments, information storage films 116 provided on an upper surface of an insulation material placed at the uppermost layer among insulation materials 112 and 112a can be removed. In some embodiments, information storage films provided at sides opposite of pillars PL from among sides of insulation materials 112 and 112a are removed.

A plurality of drains 320 are provided on pillars PL, respectively. Drains 320 may comprise a semiconductor material (e.g., silicon) having a second conductivity type, for example. Drains 320 may include an n-type semiconductor material (e.g., silicon). Below, it is assumed that drains 320 include n-type silicon. However, the inventive concept is not limited thereto. Drains 320 can be extended to the upside of channel films 114 of pillars PL.

Bit lines BL extending in the second direction are provided on drains 320 so as to be spaced apart from one another along the first direction. Bit lines BL are coupled with drains 320. In some embodiments, drains 320 and bit lines BL are connected via contact plugs (not shown). Bit lines BL typically comprise a metallic conductive material. Alternatively, bit lines BL may comprise a nonmetallic conductive material such as polysilicon.

Conductive materials CM1 to CM8 first through eighth heights according to their distance from substrate 111.

Pillars PL form a plurality of cell strings together with information storage films 116 and conductive materials CM1 to CM8. Each of pillars PL forms a cell string with information storage films 116 and adjacent conductive materials CM1 to CM8.

Pillars PL are provided on substrate 111 along row and column directions. Eighth conductive materials CM8 may constitute rows. Pillars connected with the same eighth conductive material CM8 may constitute one row. Bit lines BL constitute columns. Pillars connected with the same bit line BL constitute a column. Pillars PL constitute a plurality of strings arranged along row and column directions together with information storage films 116 and conductive materials CM1 to CM8. Each cell string comprises a plurality of cell transistors CT stacked in a direction perpendicular to substrate 111.

Figure 6:
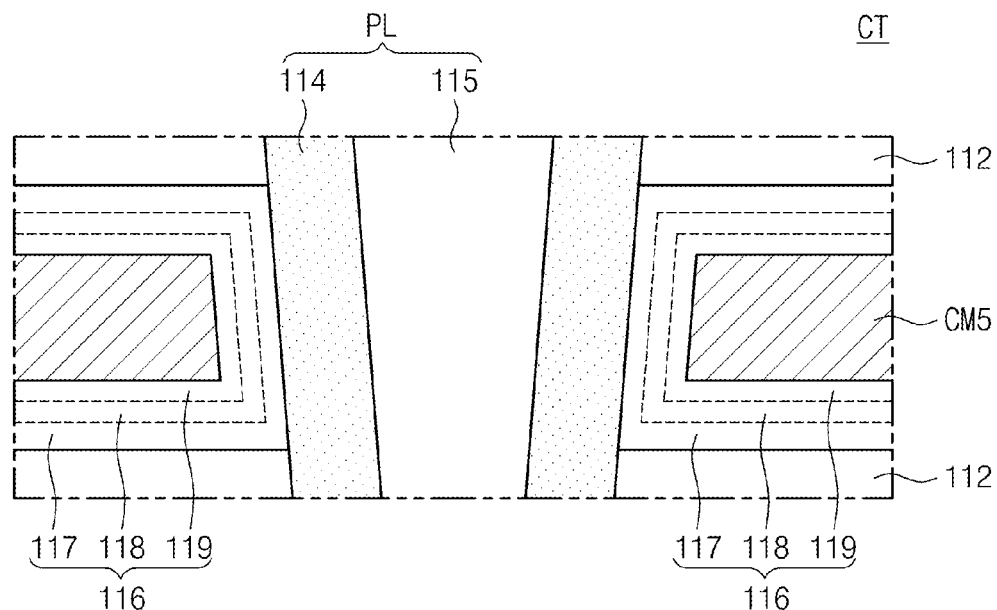
FIG. 6 is an enlarged diagram of a cell transistor shown in FIG. 5.

FIG. 6 is an enlarged diagram illustrating one of the cell transistors in FIG. 5.

Referring to FIGS. 3 to 6, cell transistors CT is formed of conductive materials CM1 to CM8, pillars PL, and information storage films 116 provided between conductive materials CM1 to CM8 and pillars PL.

Information storage films 116 extend to upper surfaces and lower surfaces of conductive materials CM1 to CM8 from regions between conductive materials CM1 to CM8 and pillars PL. Each of information storage films 116 comprises first to third sub insulation films 117, 118, and 119.

In cell transistors CT, channel films 114 of pillars PL comprise the same p-type silicon as substrate 111. Channel films 114 act as bodies of cell transistors CT. Channel films 114 are formed in a direction perpendicular to substrate 111. Channel films 114 of pillars PL act as a vertical body. Vertical channels are formed at channel films 114.

First sub insulation films 117 adjacent to pillars PL act as tunneling insulation films of cell transistors CT. For example, first sub insulation films 117 may comprise a thermal oxide film, respectively. First sub insulation films 117 may include a silicon oxide film, respectively.

Second sub insulation films 118 act as charge storage films of cell transistors CT. For example, second sub insulation films 118 may act as a charge trap film, respectively. For example, second sub insulation films 118 may comprise a nitride film or a metal oxide film, respectively.

Third sub insulation films 119 adjacent to conductive materials CM1 to CM8 may act as blocking insulation films of cell transistors CT. In this embodiment, third sub insulation films 119 may be formed of a single layer or multiple layers. Third sub insulation films 119 may be a high dielectric film (e.g., an aluminum oxide film, a hafnium oxide film, etc.) having a dielectric constant larger than those of the first and second sub insulation films 117 and 118. Third sub insulation films 119 comprise a silicon oxide film, respectively.

In some embodiments, first to third sub insulation films 117 to 119 constitute oxide-nitride-aluminum-oxide (ONA) or oxide-nitride-oxide (ONO).

Conductive materials CM1 to CM8 act as gates or control gates. Accordingly, conductive materials CM1 to CM8, third sub insulation films 119 acting as block insulation films, second sub insulation films 118 acting as charge storage films, first sub insulation films 117 acting as tunneling insulation films, and channel films 114 acting as vertical bodies may constitute a plurality of cell transistors CT stacked in a direction perpendicular to substrate 111. As an example, cell transistors CT may be a charge trap type cell transistor.

Cell transistors CT can be used for different purposes according to their respective heights. For example, among cell transistors CT, cell transistors having at least one height and placed at an upper portion may be used as string selection transistors. The string selection transistors may be configured to perform switching operations between cell strings and bit lines. Among cell transistors CT, cell transistors having at least one height and placed at a lower portion may be used as ground selection transistors. The ground selection transistors may be configured to perform switching operations between cell strings and a common source line formed of common source regions CSR. Cell transistors between cell transistors used as string and ground selection transistors may be used as memory cells and dummy memory cells.

Conductive materials CM1 to CM8 may extend along the first direction to be connected with pillars PL. Conductive materials CM1 to CM8 may constitute conductive lines interconnecting cell transistors CT of pillars PL. In this embodiment, conductive materials CM1 to CM8 may be used as a string selection line, a ground selection line, a word line, or a dummy word line according to the height.

Conductive lines interconnecting cell transistors used as string selection transistors may be used as string selection lines. Conductive lines interconnecting cell transistors used as ground selection transistors may be used as ground selection lines. Conductive lines interconnecting cell transistors used as memory cells may be used as word lines. Conductive lines interconnecting cell transistors used as dummy memory cells may be used as dummy word lines.

Figure 7:
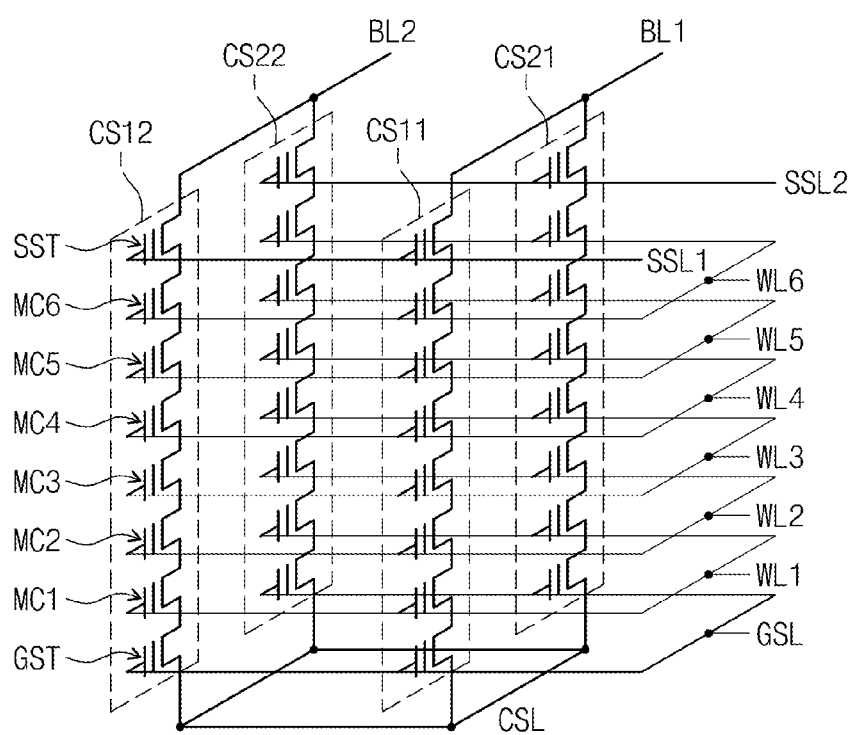
FIG. 7 is a circuit diagram illustrating an equivalent circuit of a part EC shown in FIG. 3 according to an embodiment of the inventive concept.

FIG. 7 is a circuit diagram illustrating an equivalent circuit of a part EC shown in FIG. 3 according to an embodiment of the inventive concept.

Referring to FIGS. 3 to 7, cell strings CS11, CS12, CS21, and CS22 are provided between bit lines BL1 and BL2 and a common source line CSL. Cell strings CS11 and CS21 are connected between first bit line BL1 and common source line CSL, and cell strings CS12 and CS22 are connected between second bit line BL2 and common source line CSL. Common source regions CSR are connected in common to form a common source line CSL.

Cell strings CS11, CS12, CS21, and CS22 correspond to four pillars of the part EC shown in FIG. 3. The four pillars constitute four cell strings CS11, CS12, CS21, and CS22 together with conductive materials CM1 to CM8 and information storage films 116.

In some embodiments, first conductive materials CM1 constitute ground selection transistors GST with information storage films 116 and pillars PL. First conductive materials CM1 form a ground selection line GSL. First conductive materials CM1 are interconnected to form a ground selection line GSL.

Second to seventh conductive materials CM2 to CM7 constitute first to sixth memory cells MC1 to MC6 with information storage films 116 and pillars PL. Second to seventh conductive materials CM2 to CM7 are used as second to sixth word lines WL2 to WL6.

Second conductive material CM2 are interconnected to form the first word line WL1. Third conductive material CM3 is interconnected to form second word line WL2. Fourth conductive material CM4 is interconnected to form third word line WL3. Fifth conductive material CM5 is interconnected to form fourth word line WL4. Sixth conductive material CM6 is interconnected to form fifth word line WL5. Seventh conductive material CM7 is interconnected to form sixth word line WL6.

Eighth conductive materials CM8 constitute string selection transistors SST with information storage films 116 and pillars PL. Eighth conductive materials CM8 form string selection lines SSL1 and SSL2.

Memory cells of the same height are connected in common with one word line. Accordingly, when applied to a word line of a specific height, a voltage may be applied to all cell strings CS11, CS12, CS21, and CS22.

Cell strings in different rows are connected with different string selection lines SSL1 and SSL2, respectively. Cell strings CS11, CS12, CS21, and CS22 are selected or unselected by the row by selecting or unselecting the string selection lines SSL1 and SSL2. For example, cell strings (CS11 and CS12) or (CS21 and CS22) connected with an unselected string selection line SSL1 or SSL2 may be electrically separated from bit lines BL1 and BL2. Cell strings (CS21 and CS22) or (CS11 and CS12) connected with a selected string selection line SSL2 or SSL1 may be electrically connected with bit lines BL1 and BL2.

Cell strings CS11, CS12, CS21, and CS22 may be connected with bit lines BL1 and BL2 by the column. Cell strings CS11 and CS21 may be connected with bit line BL1, and cell strings CS12 and CS22 may be connected with bit line BL2. Cell strings CS11, CS12, CS21, and CS22 may be selected and unselected by the column by selecting and unselecting bit lines BL1 and BL2.

Figure 8:
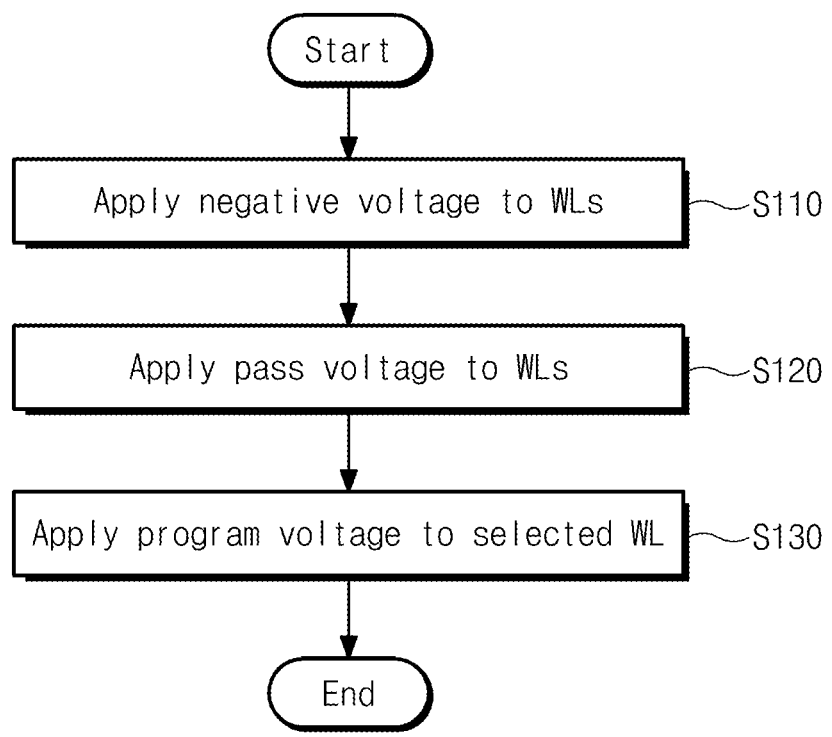
FIG. 8 is a flowchart illustrating a method of programming a nonvolatile memory device according to an embodiment of the inventive concept.

FIG. 8 is a flowchart illustrating a method of programming a nonvolatile memory device according to an embodiment of the inventive concept. For explanation purposes, it will be assumed that the method is performed in the context of memory block BLKa1. However, the method is not restricted to this example context. In the description that follows, example method features will be indicated by parentheses (SXXX).

Referring to FIGS. 1 to 8, a negative voltage is applied to word lines WL1 to WL6 (S110). For example, preliminary program controller RPGMC may control address decoder 120 such that a negative voltage (e.g., −4 V) is applied to word lines WL1 to WL6.

Thereafter, pass voltage VPASS is applied to word lines WL1 to WL6 (S120). For example, program controller PGMC controls address decoder 120 such that pass voltage VPASS is applied to word lines WL1 to WL6. Pass voltage VPASS is typically a high voltage that is higher than a power supply voltage VCC and obtained by pumping the power supply voltage VCC.

Next, program voltage VPGM is applied to a selected word line among word lines WL1 to WL6 (S130). For example, program controller PGMC may control address decoder 120 to apply program voltage VPGM to a selected one of word lines WL1 to WL6. Program voltage VPGM is typically a higher voltage than pass voltage VPASS.

Figure 10:
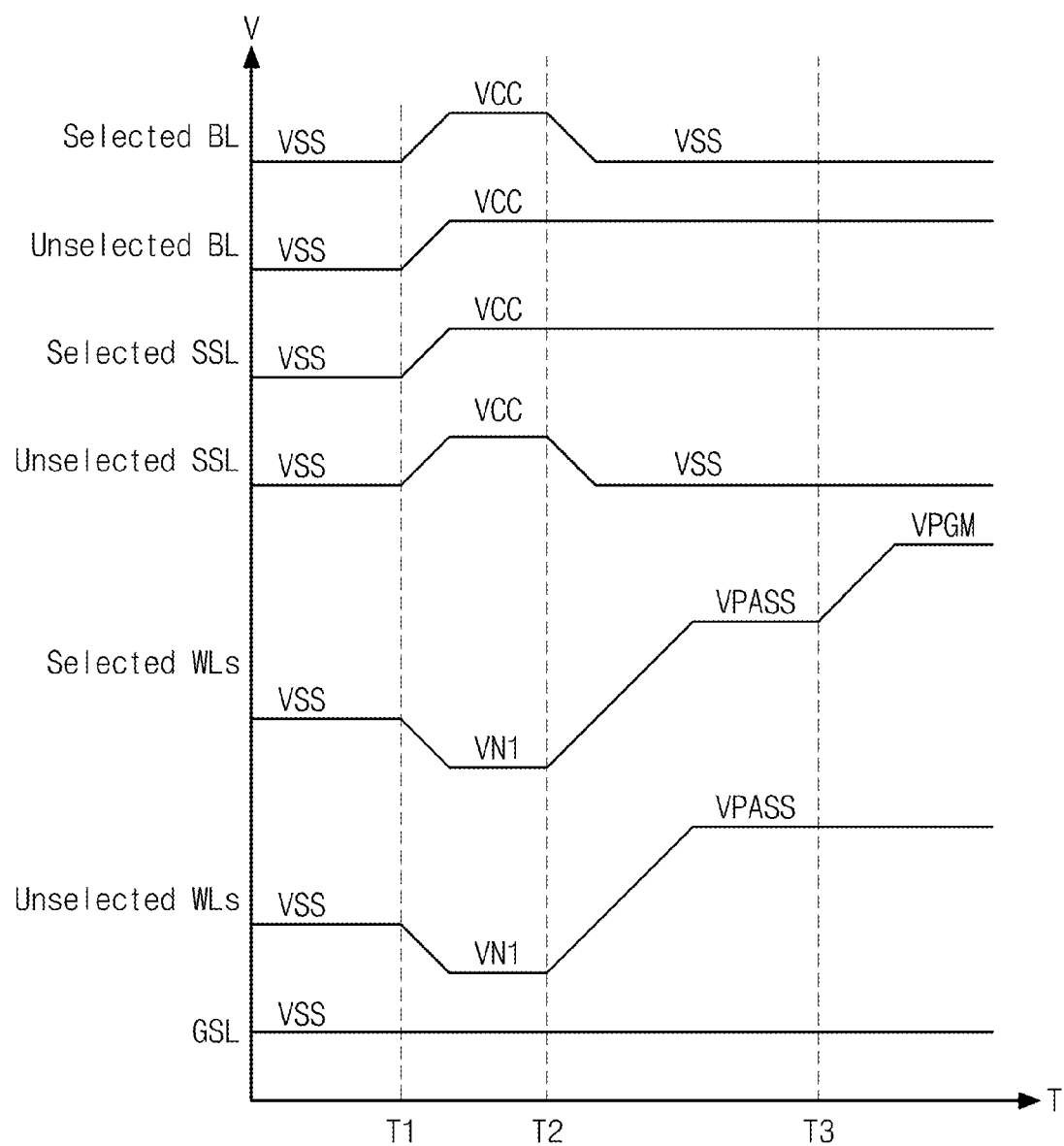
FIG. 10 is a timing diagram illustrating a variation in voltages according to the bias conditions of FIG. 9.

FIG. 9 is a table illustrating bias conditions of a memory cell array in a program operation. FIG. 10 is a timing diagram illustrating a variation in voltages according to the bias conditions in FIG. 9. In FIG. 10, a horizontal axis represents time, and a vertical axis indicates voltage.

Referring to FIGS. 1 to 10, at a time T1, a preliminary program controller RPGMC controls a preliminary program operation, a negative voltage VN1 is applied to word lines WL1 to WL6 under the control of preliminary program controller RPGMC, and a ground voltage VSS is supplied to a ground selection line GSL. Consequently, ground selection transistors GST are turned off.

A turn-on voltage is applied to string selection lines SSL1 and SSL2. The turn-on voltage may be a voltage for turning on string selection transistors SST. In some embodiments, the turn-on voltage may be a power supply voltage VCC.

A positive voltage is applied to bit lines BL1 and BL2. In some embodiments, the power supply voltage VCC may be applied to bit lines BL1 and BL2.

At a time T2, program controller PGMC controls a program operation. A pass voltage VPASS is provided to word lines WL1 to WL6 under the control of program controller PGMC. Ground voltage VSS is applied to a ground selection line GSL. Ground selection line GSL maintains ground voltage VSS from the preliminary program operation.

A turn-on voltage is applied to a selected string selection line (e.g., SSL1), and a turn-off voltage is applied to an unselected string selection line (e.g., SSL2). For example, a power supply voltage VCC may be applied to the selected string selection line SSL1, and the ground voltage may be applied to the unselected string selection line SSL2. The selected string selection line SSL1 maintains power supply voltage VCC from the preliminary program operation.

Ground voltage VSS is supplied to a selected bit line (e.g., BL1), and power supply voltage VCC is applied to an unselected bit line (e.g., BL2). The unselected bit line BL2 maintains power supply voltage VCC from the preliminary program operation.

At a time T3, under the control of program controller PGMC, a program voltage VPGM is applied to a word line (e.g., WL4) selected from among word lines WL1 to WL6.

Figure 11:
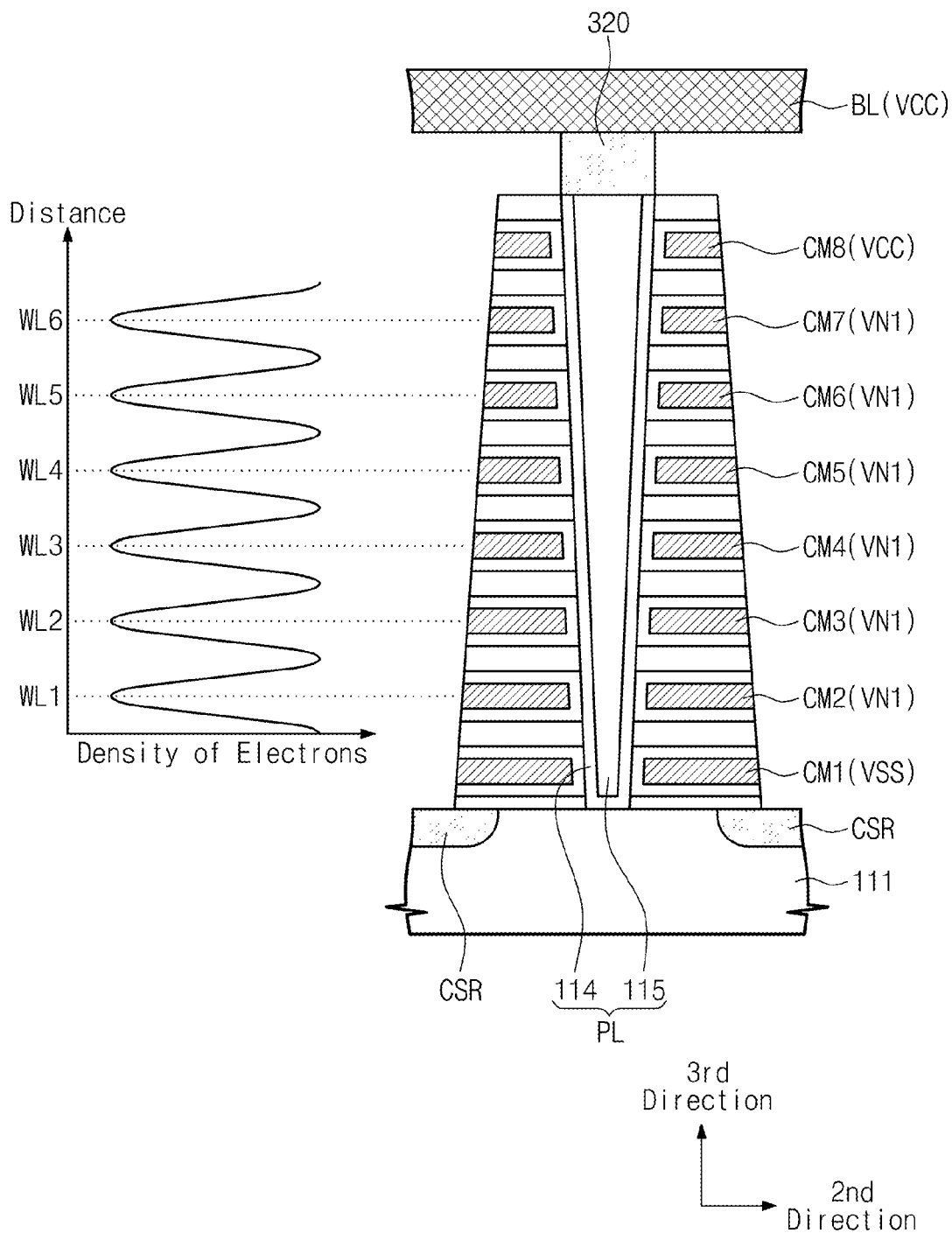
FIG. 11 is a diagram illustrating a part of the cross-sectional view shown in FIG. 5.

FIG. 11 is a diagram illustrating a part FIG. 5 in further detail. Of particular note, FIG. 11 shows bias conditions in a program operation and the density of electrons of channel films according to the bias conditions.

Referring to FIGS. 1 to 11, string selection transistors SST formed by eight conductive materials CM8 is turned on in a program operation. Ground selection transistors GST formed by first conductive materials CM1 are turned off in the program operation. A negative voltage VN1 is applied to word lines WL1 to WL6 formed by second to seventh conductive materials CM2 to CM7.

An electric field is formed between the second to seventh conductive materials CM2 to CM7 and channel films 114 by negative voltage VN1 applied to word lines WL1 to WL6. Electrons of the channel films are pushed and discharged from channel films 114. The pushed and discharged electrons are transferred to bit lines BL1 and BL2 via the turned-on string selection transistors SST. A shift of electrons is accelerated by a positive voltage (e.g., a power supply voltage VCC) applied to bit lines BL1 and BL2.

Where electrons are pushed and discharged from channel films 114, the density of electrons of channel films 114 may be lowered. This may enable a boosting efficiency of channel films 114 to be improved where a pass voltage VPASS is applied to second to seventh conductive materials CM2 to CM7.

The density of electrons in parts of channel films 114 placed at locations corresponding to second to seventh conductive materials CM2 to CM7 is less than that of other parts. The parts of channel films 114 placed at locations corresponding to the second to seventh conductive materials CM2 to CM7 (portions of channel films 114 having a low electron density) may act as barriers impeding the charge sharing. That is, a charge sharing effect at channel films 114 may be reduced by the negative voltage applied to the second to seventh conductive materials CM2 to CM7. Channel films 114 may be understood to be localized with respect to the charge sharing due to self-isolation of channel films 114.

Where channel films 114 are localized, a voltage of a portion, corresponding to the selected word line WL4, from among localized portions of channel films 114 may be boosted when a program voltage VPGM is applied to the selected word line WL4. A boosting efficiency may be improved because boosting is made not at the whole of channel films 114 but at a portion corresponding to the selected word line WL4 from among localized portions of channel films 114.

In other words, where a preliminary program operation is performed, the density of electrons of channel films 114 may be lowered in order to improve boosting efficiency. Further, because channel films 114 are localized, the boosting efficiency may be further improved. Thus, memory cells of unselected cell strings may be program inhibited, and a nonvolatile memory device 100 with an improved reliability and a program method thereof may be provided.

Figure 12:
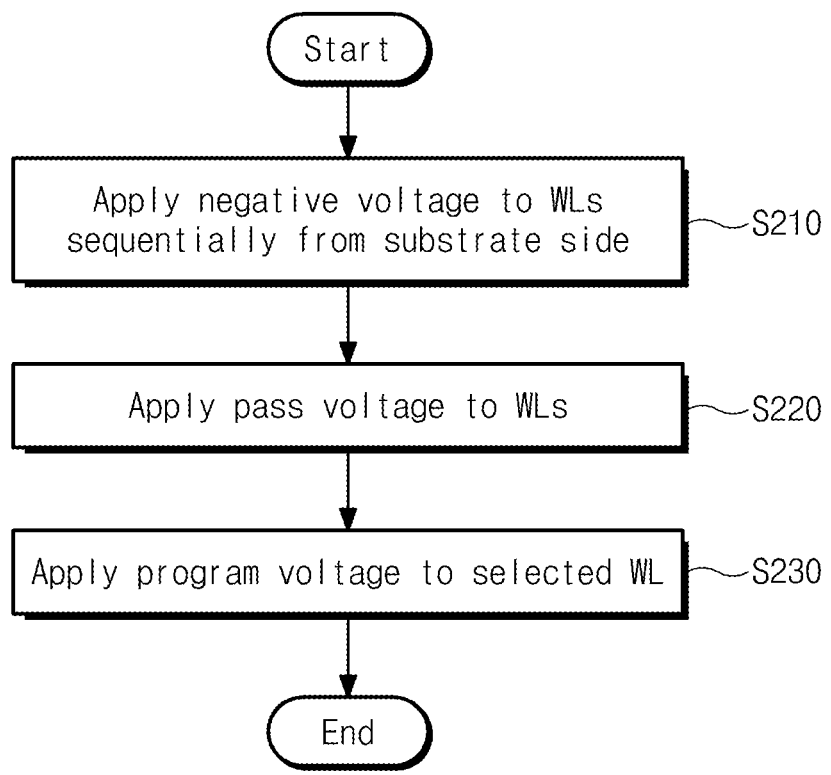
FIG. 12 is a flowchart illustrating a method of programming a nonvolatile memory device according to another embodiment of the inventive concept.

FIG. 12 is a flowchart illustrating a method of programming a nonvolatile memory device according to another embodiment of the inventive concept.

Referring to FIGS. 1 to 7 and 12, a negative voltage VN1 is sequentially applied to word lines WL1 to WL6 (S210). For example, under the control of a preliminary program controller RPGMC, address decoder 120 applies a negative voltage sequentially from a word line WL1 close to substrate 111 to a word line WL6 far away from substrate WL6.

Next, a pass voltage VPASS is applied to word lines WL1 to WL6 (S220). Then, a program voltage VPGM is applied to a selected word line WL4 (S230). Operations S220 and S230 may be performed in the same manner as operations S120 and S130 described in relation to FIG. 8.

Figure 13:
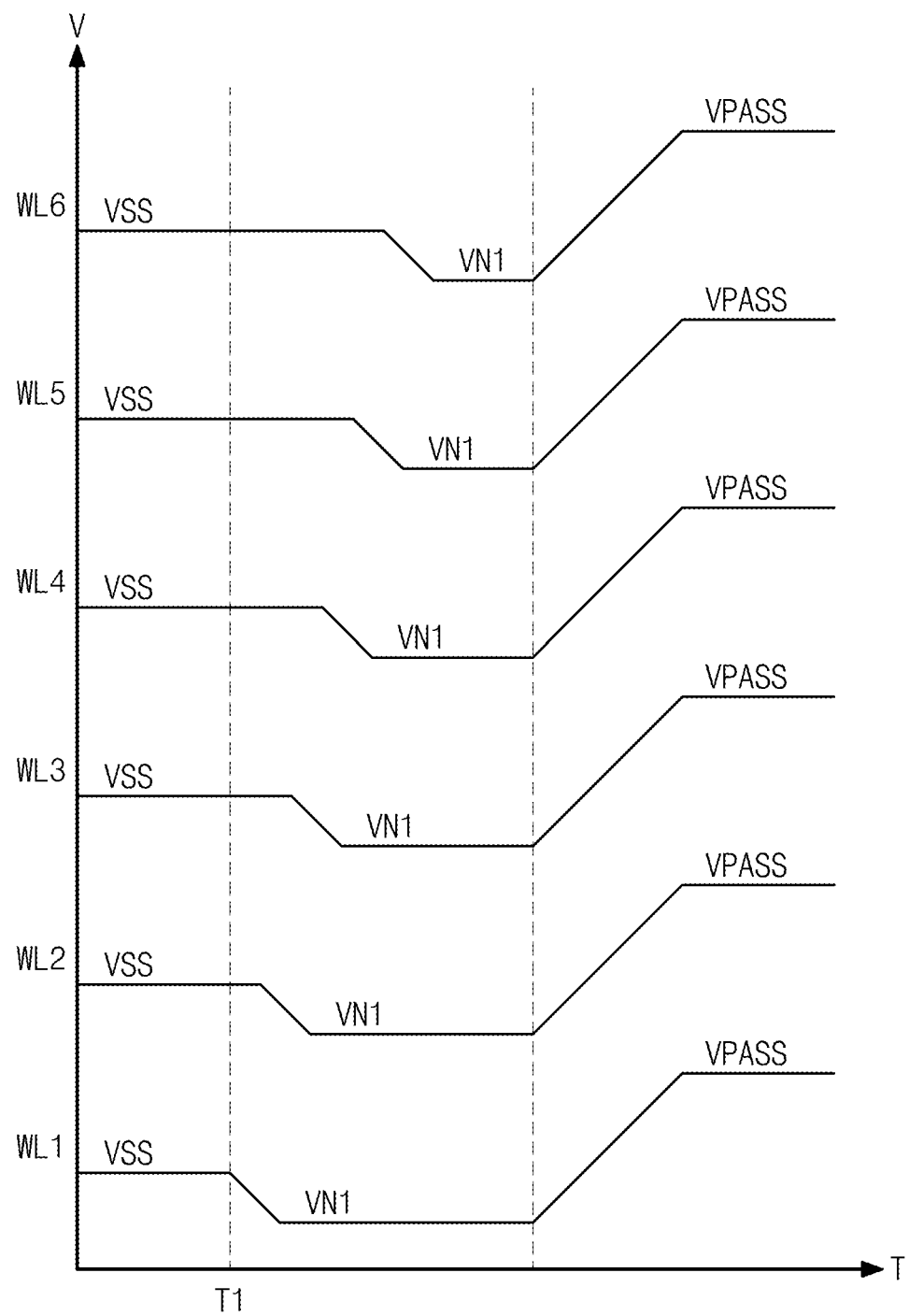
FIG. 13 is a timing diagram illustrating a variation in voltages in the method of FIG. 12.

FIG. 13 is a timing diagram illustrating a variation of voltages in the method of FIG. 12. In FIG. 13, a horizontal axis represents time, and a vertical axis represents voltage.

Referring to FIGS. 1 to 7, 12, and 13, at a time T1, a negative voltage VN1 is applied to a word line WL1 closest to substrate 111. Afterwards, negative voltage VN1 is applied to word lines WL2 to WL6 sequentially according to an order stacked from substrate 111.

Where negative voltage VN1 is applied to word line WL1, electrons of portions of channel films 114 adjacent to word line WL1 are pushed and discharged to portions of the channel films adjacent to word lines WL2 to WL6. Where negative voltage VN1 is applied to word line WL2, electrons of portions of channel films 114 adjacent to word line WL2 may be pushed and discharged to portions of the channel films adjacent to word lines WL3 to WL6.

Where negative voltage VN1 is sequentially applied from word line WL1 closest to substrate 111 to word line WL6 farther away from substrate 111, electrons of channel films 114 are sequentially shifted into bit lines BL1 and BL2 from portions of channel films 114 adjacent to a ground selection transistor GST. Thus, a boosting efficiency is improved by effectively reducing the density of electrons of channel films 114.

Figure 14:
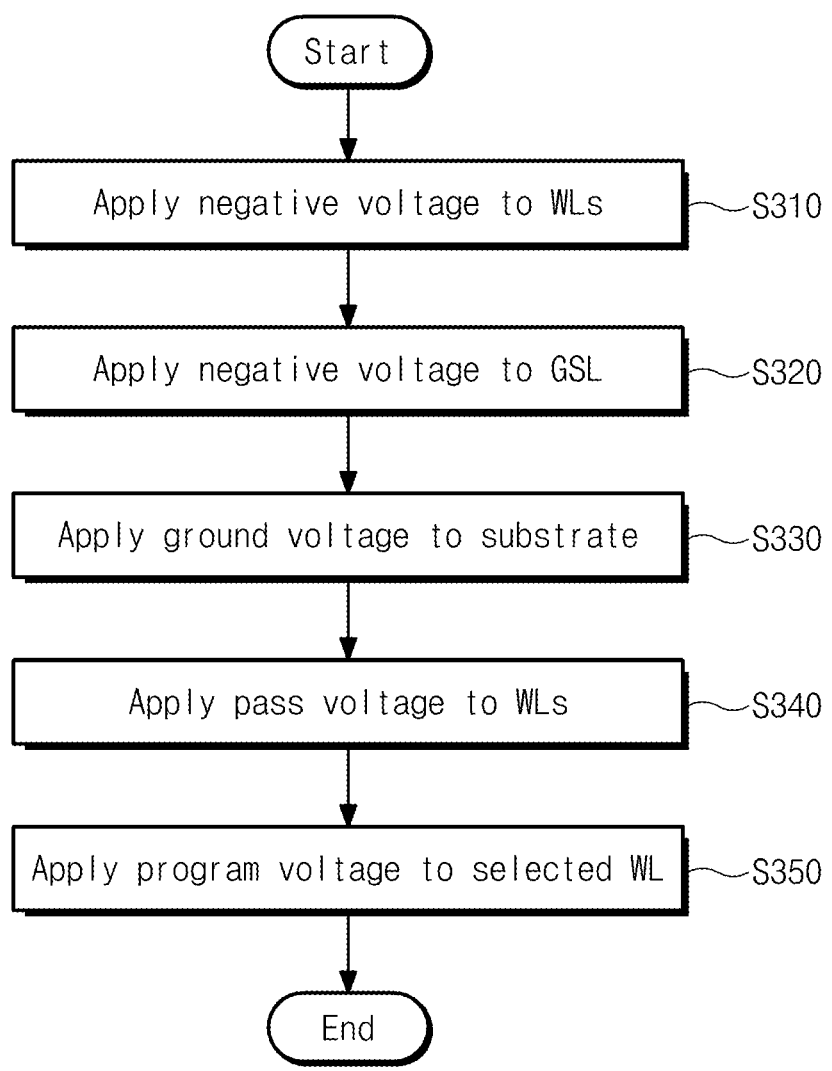
FIG. 14 is a flowchart illustrating a method of programming a nonvolatile memory device according to still another embodiment of the inventive concept.

FIG. 14 is a flowchart illustrating a method of programming a nonvolatile memory device according to still another embodiment of the inventive concept.

Referring to FIGS. 1 to 7 and 14, a negative voltage VN1 is applied to word lines WL1 to WL6 (S310). Operation S310 can be performed in the same manner as operation S110 described in relation to FIG. 8 or operation S210 described in relation to FIG. 12.

Next, a negative voltage VN2 may be applied to a ground selection line GSL (S320). In some embodiments, under the control of a preliminary program controller RPGMC, address decoder 120 applies negative voltage VN2 to the ground selection line GSL.

Thereafter, a ground voltage VSS is applied to substrate 111 (S330). In some embodiments, ground voltage VSS is applied to substrate 111 under the control of preliminary program controller RPGMC.

Then, a pass voltage VPASS is applied to word lines WL1 to WL6 (S340). Operation S340 may be performed in the same manner as operation S120 described in relation to FIG. 8.

Next, a program voltage VPGM is applied to a selected word line WL4 (S350). Operation S350 may be performed in the same manner as operation S130 described in relation to FIG. 8.

Figure 16:
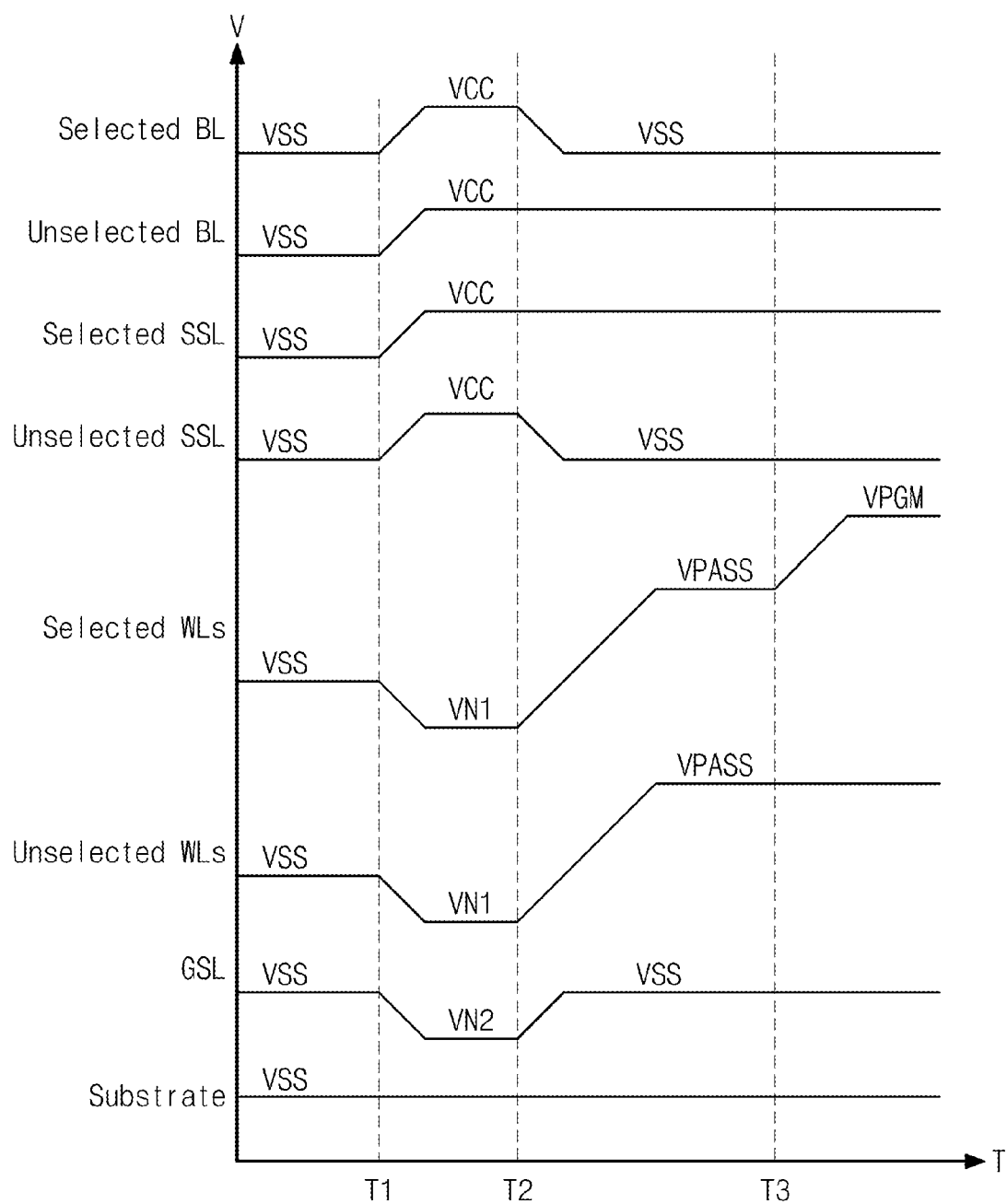
FIG. 16 is a timing diagram illustrating a variation in voltages according to the bias conditions of FIG. 15.

FIG. 15 is a table illustrating bias conditions of a memory cell array in the method of FIG. 14. FIG. 16 is a timing diagram illustrating a variation in voltages according to the bias conditions shown in FIG. 15. In FIG. 16, a horizontal axis represents time, and a vertical axis represents voltage.

Referring to FIGS. 1 to 7 and 14 to 16, at a time T1, preliminary program controller RPGMC controls a preliminary program operation. Ground voltage VSS is applied to substrate 111. Negative voltage VN2 is applied to ground selection line GSL. Negative voltage VN1 is applied to word lines WL1 to WL6. As described with reference to FIGS. 12 and 13, negative voltage VN1 may be sequentially applied to word lines WL1 to WL6. A positive voltage (e.g., a power supply voltage VCC) may be applied to string selection lines SSL1 and SSL2. A positive voltage (e.g., a power supply voltage VCC) may be applied to bit lines BL1 and BL2.

Compared with the timing diagram in FIG. 10, a ground voltage VSS is applied to substrate 111, and negative voltage VN2 is supplied to a ground selection line GSL. Channel films 114 may have the same conductive type as substrate 111 or they may be intrinsic silicon, for example. Where ground voltage VSS is applied to substrate 111, holes may be supplied to channel films 114 from substrate 111 when electrons of channel films 114 are shifted into bit lines BL1 and BL2. Potentials of channel films 114 may become high by holes supplied to channel films 114, so that a boosting efficiency is improved.

Doping concentration of channel films 114 may be lower than that of substrate 111. Thus, to shift holes of substrate 111 into channel films 114, holes may jump over an energy barrier between substrate 111 and channel films 114. Where negative voltage VN2 is supplied to the ground selection line GSL, holes may be converged at portions of channel films 114 corresponding to the ground selection line GSL. The converged holes may mitigate the energy barrier between substrate 111 and channel films 114. That is, if negative voltage VN2 is applied to the ground selection line GSL, holes may shift into channel films 114 from substrate 111.

Figure 17:
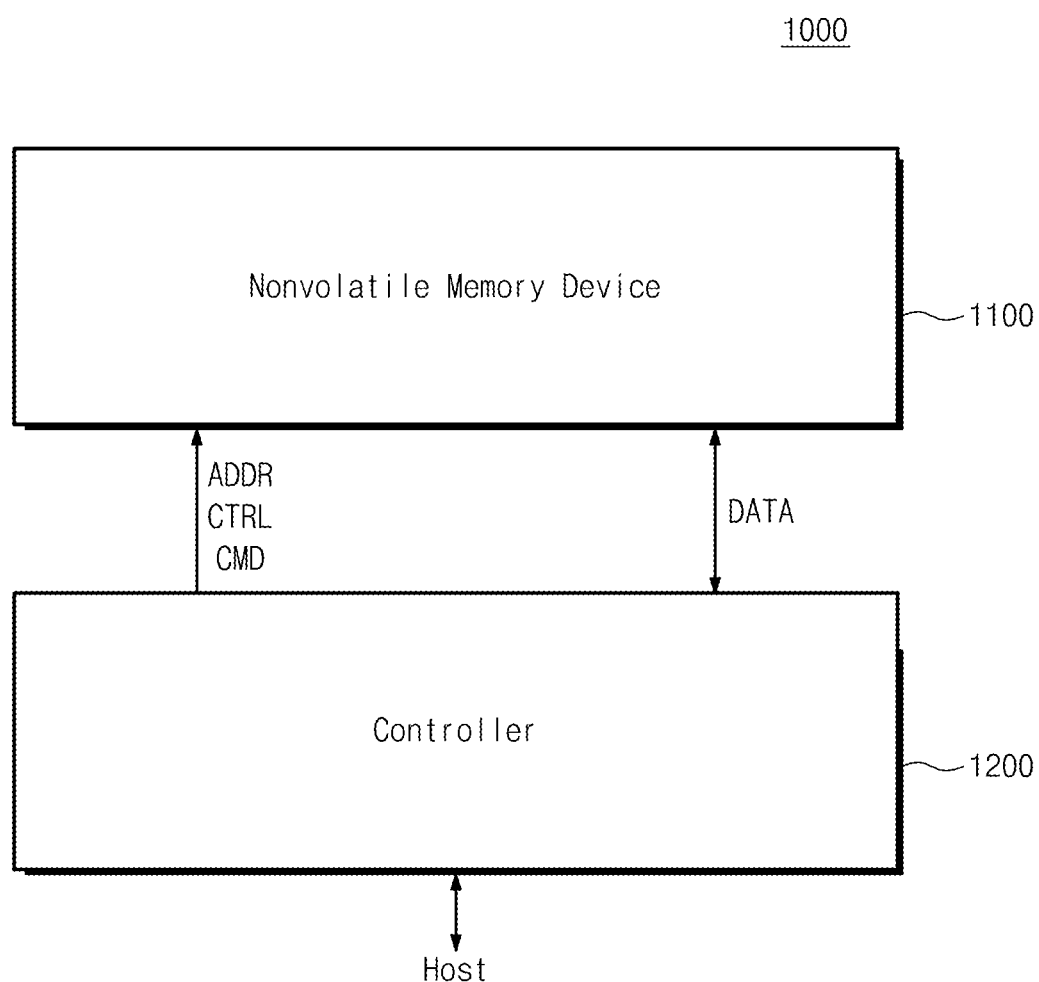
FIG. 17 is a block diagram illustrating a memory system according to an embodiment of the inventive concept.

FIG. 17 is a block diagram illustrating a memory system 1000 according to an embodiment of the inventive concept.

Referring to FIG. 17, memory system 1000 comprises a nonvolatile memory device 1100 and a controller 1200.

Nonvolatile memory device 1100 may be implemented substantially the same as nonvolatile memory devices described above in relation to other embodiments. For example, nonvolatile memory device 1100 may include a plurality of cell strings CS11, CS12, CS21, and CS22 provided on substrate 111, each of the strings comprising a plurality of cell transistors CT stacked in a direction perpendicular to substrate 111. Nonvolatile memory device 1100 may perform a program operation according to the above-described program method.

Controller 1200 is connected with a host and nonvolatile memory device 1100. In response to a request from the host, controller 1200 accesses nonvolatile memory device 1100. For example, controller 1200 may be configured to control a read operation, an erase operation, a state read operation, a program operation for rearranging data, and a background operation of nonvolatile memory device 1100. Controller 1200 is configured to provide an interface between nonvolatile memory device 1100 and the host. Controller 1200 is further configured to drive firmware for controlling nonvolatile memory device 1100.

Controller 1200 provides nonvolatile memory device 1100 with a control signal CTRL, a command CMD, and an address ADDR. In response to control signal CTRL, command CMD, and address ADDR provided from controller 1200, nonvolatile memory device 1100 performs a read operation, an erase operation, or a program operation.

In some embodiments, controller 1200 may further include constituent elements such as a processing unit, a host interface, and a memory interface. The processing unit may control an overall operation of controller 1200.

The host interface implements a protocol for executing data exchange between host and controller 1200. For example, the host interface may communicate with an external device (e.g., the host) via at least one of various protocols such as an Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol. The memory interface interfaces with nonvolatile memory device 1100. The memory interface may be, for instance, a NAND interface or a NOR interface.

Memory system 1000 can be used as computer, portable computer, Ultra Mobile PC (UMPC), workstation, net-book, PDA, web tablet, wireless phone, mobile phone, smart phone, e-book, portable multimedia player (PMP), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system.

A nonvolatile memory device 1100 or a memory system 1000 may be packed by various types of packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Figure 18:
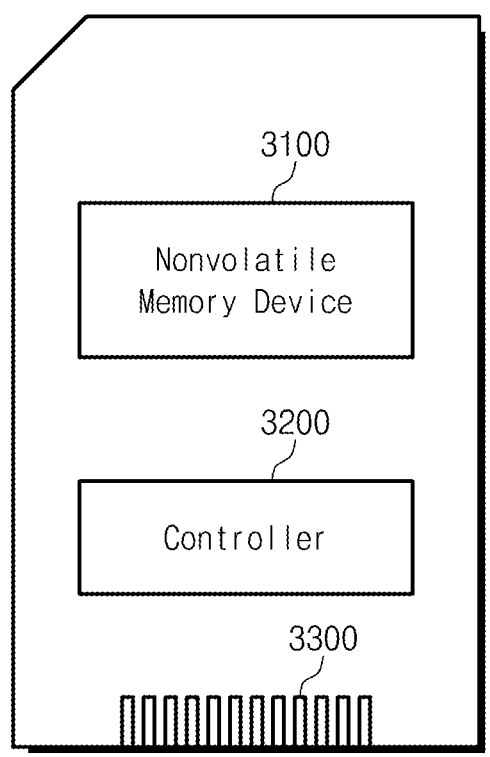
FIG. 18 is a diagram illustrating a memory card according to an embodiment of the inventive concept.

FIG. 18 is a diagram illustrating a memory card 3000 according to an embodiment of the inventive concept.

Referring to FIG. 18, memory card 3000 comprises a nonvolatile memory device 3100, a controller 3200, and a connector 3300.

Nonvolatile memory device 3100 may be substantially the same as nonvolatile memory devices described above in relation to other embodiments. For example, nonvolatile memory device 3100 may comprise a plurality of cell strings CS11, CS12, CS21, and CS22 provided on substrate 111, each cell string comprising a plurality of cell transistors CT stacked in a direction perpendicular to substrate 111. In addition, nonvolatile memory device 3100 may perform a program operation according to a method described above in relation to other embodiments. Controller 3200 may control nonvolatile memory device 3100 to perform the program operation.

Connector 3300 may connect memory card 3000 with a host electrically.

Memory card 3000 may be formed of memory cards such as a PC (PCMCIA) card, a CF card, an SM (or, SMC) card, a memory stick, a multimedia card (MMC, RS-MMC, MMC-micro), a security card (SD, miniSD, microSD, SDHC), a universal flash storage (UFS) device, and the like.

Figure 19:
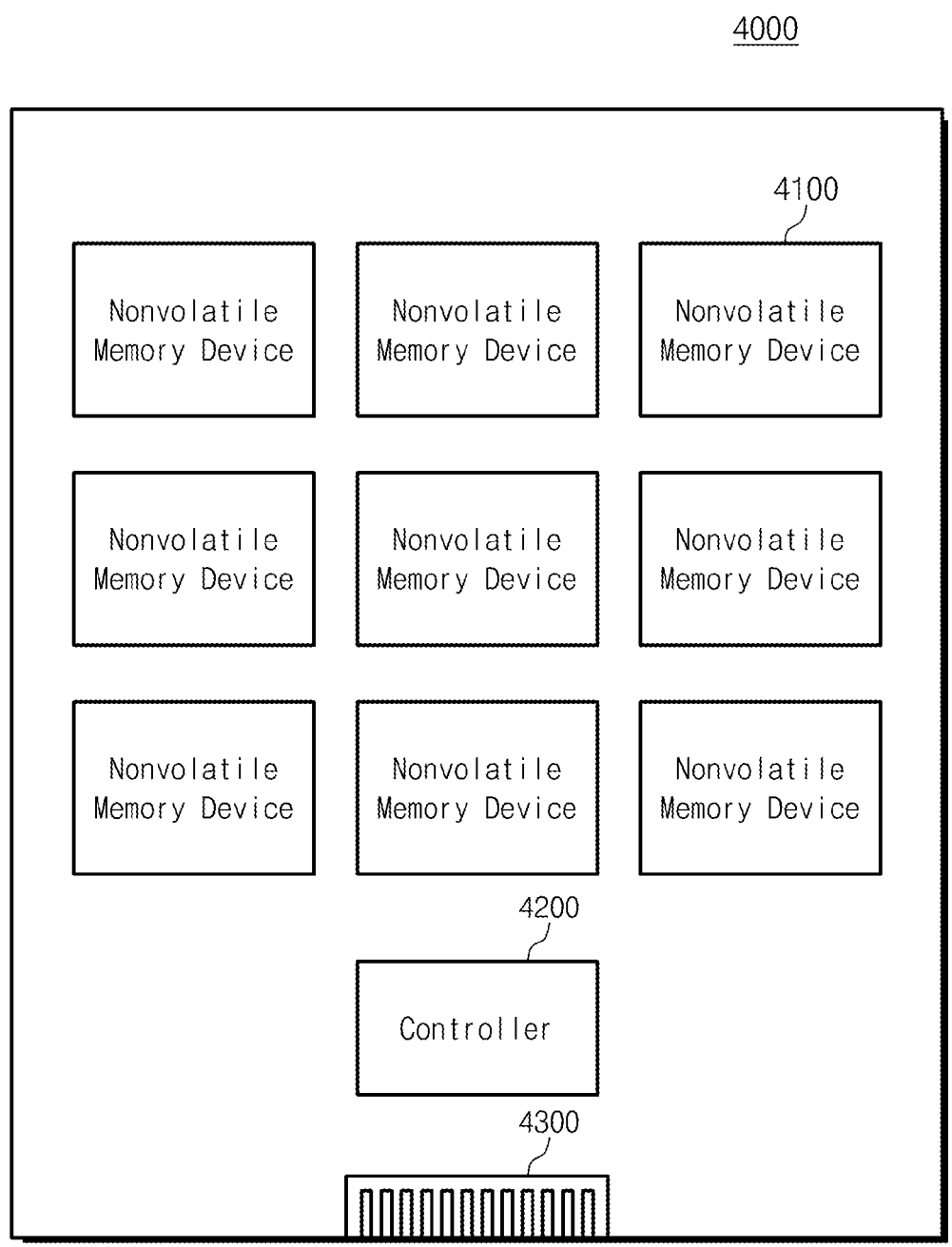
FIG. 19 is a diagram illustrating a solid state drive according to an embodiment of the inventive concept.

FIG. 19 is a diagram illustrating a solid state drive (SSD) 4000 according to an embodiment of the inventive concept.

Referring to FIG. 19, SSD 4000 comprises a plurality of nonvolatile memory devices 4100, a controller 4200, and a connector 4300.

Each of nonvolatile memory devices 4100 may be implemented substantially the same as other embodiments described above. For example, each of nonvolatile memory devices 4100 may comprise a plurality of cell strings CS11, CS12, CS21, and CS22 provided on substrate 111, where each cell string comprises a plurality of cell transistors CT stacked in a direction perpendicular to substrate 111. Each of nonvolatile memory devices 4100 may perform a program operation according to the above-described program method. Controller 4200 may control nonvolatile memory devices 4100 to perform a program operation according to embodiments of the inventive concept. Connector 4300 may connect solid state driver 4000 with a host electrically.

Figure 20:
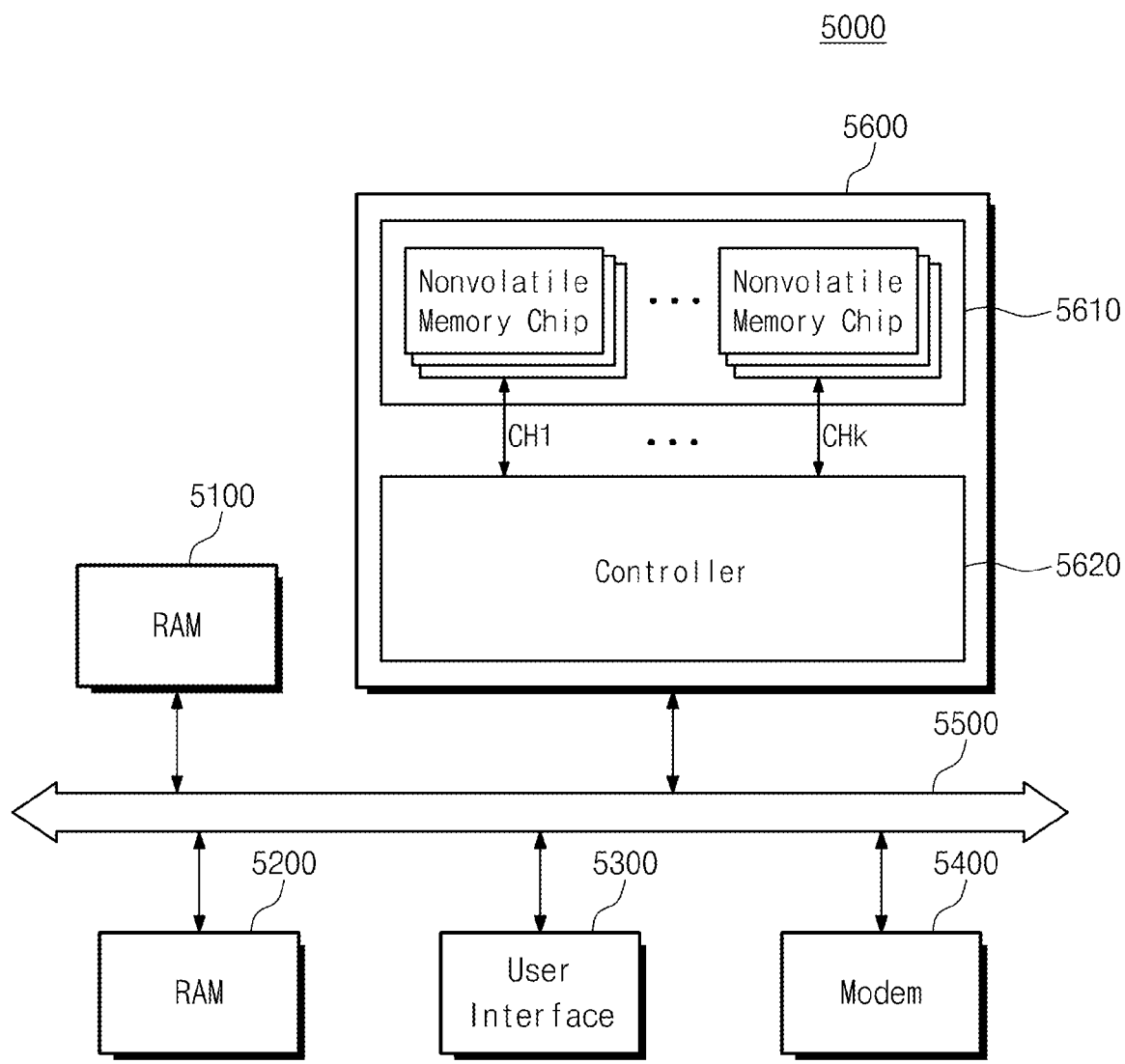
FIG. 20 is a block diagram illustrating a computing system according to an embodiment of the inventive concept.

FIG. 20 is a block diagram illustrating a computing system 5000 according to an embodiment of the inventive concept.

Referring to FIG. 20, a computing system 5000 comprises a central processing unit 5100, a RAM 5200, a user interface 5300, a modem 5400, and a memory system 5600.

Memory system 5600 is connected electrically with elements 5100 to 5400 via a system bus 5500. Data provided via user interface 5300, processed by central processing unit 5100, or received via modem 5400 may be stored in memory system 5600.

Memory system 5600 comprises a nonvolatile memory device 5610 and a controller 5620. Nonvolatile memory device 2100 comprises a plurality of nonvolatile memory chips, which form a plurality of groups. Nonvolatile memory chips in each group are configured to communicate with controller 5620 via one common channel. In some embodiments, nonvolatile memory chips communicate with controller 5620 via a plurality of channels CH1 to CHk.

Each of the nonvolatile memory chips may be implemented similar to embodiments described above. For example, each of the nonvolatile memory chips may include a plurality of cell strings CS11, CS12, CS21, and CS22 provided on substrate 111, where each of the cell strings comprises a plurality of cell transistors CT stacked in a direction perpendicular to substrate 111. Nonvolatile memory device 5610 performs a program operation according to the above-described program method. Controller 5620 controls nonvolatile memory device 5610 to perform a program operation according to embodiments of the inventive concept.

Although FIG. 20 shows a plurality of nonvolatile memory chips is connected to one channel, memory system 5600 can be modified such that one nonvolatile memory chip is connected to one channel. In addition, although FIG. 20 shows nonvolatile memory device 5610 connected to system bus 5500 via a controller 5620, nonvolatile memory device 5610 can be electrically connected directly to system bus 5500.

As indicated by the foregoing, in various embodiments of the inventive concept, after a negative voltage is applied to word lines, a pass voltage is applied to the word lines. The density of electrons of a channel may be reduced by the negative voltage, and self-isolation may be generated. Thus, a boosting efficiency of a channel of an unselected cell string may be improved, and a nonvolatile memory device with an improved reliability and a program method thereof may be provided.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a nonvolatile memory device comprising a plurality of cell strings formed on a substrate, each of the cell strings comprising at least one ground selection transistor, a plurality of memory cells, and at least one string selection transistor stacked in a direction perpendicular to the substrate, the method comprising:
   applying a negative voltage to a selected word line connected to a selected memory cell in one of the cell strings and to unselected word lines connected to unselected memory cells in the one of the cell strings;
   applying a pass voltage to the selected word line and the unselected word lines after applying the negative voltage to the selected word line and the unselected word lines; and
   applying a program voltage to the selected word line while continuing to apply the pass voltage to the unselected word lines.

2. The method of claim 1, further comprising applying a turn-on voltage to string selection lines connected with string selection transistors of the cell strings while the negative voltage is applied to the selected word line and the unselected word lines.

3. The method of claim 2, wherein the turn-on voltage is a power supply voltage.

4. The method of claim 2, further comprising applying a turn-off voltage to unselected string selection lines of the string selection lines while the pass voltage is applied to the selected word line and the unselected word lines.

5. The method of claim 4, wherein the turn-off voltage is a ground voltage.

6. The method of claim 2, further comprising applying a power supply voltage to bit lines connected to string selection transistors of the cell strings while the negative voltage is applied to the selected word line and the unselected word lines.

7. The method of claim 2, further comprising applying a ground voltage to selected bit lines connected to the selected memory cells while the pass voltage is applied to the selected word line and the unselected word lines.

8. The method of claim 1, further comprising applying a turn-off voltage to a ground selection line connected to ground selection transistors of cell strings during a program operation.

9. The method of claim 8, wherein the turn-off voltage is a ground voltage.

10. The method of claim 8, wherein applying the turn-off voltage to the ground selection line comprises:
    applying a second negative voltage to the ground selection line while the negative voltage is applied to the selected word line and the unselected word lines; and
    applying a ground voltage to the ground selection line while the pass voltage is applied to the selected word line and the unselected word lines.

11. The method of claim 10, further comprising applying the ground voltage to the substrate while the negative voltage is applied to the ground selection line.

12. The method of claim 1, wherein applying the negative voltage to the selected word line and the unselected word lines comprises applying the negative voltage sequentially from a word line closer to the substrate to a word line farther from the substrate.

13. A nonvolatile memory device, comprising:
a plurality of cell strings formed on a substrate, each of the cell strings comprising a plurality of memory cells stacked in a direction perpendicular to the substrate;
an address decoder connected to the cell strings via a plurality of word lines; and
a read/write circuit connected to the cell strings via a plurality of bit lines,
wherein in a program operation, the address decoder is configured to apply a negative voltage to the plurality of word lines connected to one of the cell strings and to then apply a program voltage to a selected word line among the plurality of word lines.

14. The nonvolatile memory device of claim 13, wherein memory cells located at a common distance from the substrate are connected in common to a word line.

15. The nonvolatile memory device of claim 13, wherein, in the program operation, the address decoder is configured to apply a second negative voltage to a ground selection line connected with ground selection transistors of the cell strings and to then apply a ground voltage to the ground selection line.

16. The nonvolatile memory device of claim 13, wherein in the program operation, the address decoder is further configured to apply a pass voltage to the plurality of wordlines after applying the negative voltage to the plurality of word lines and before applying the program voltage to a selected word line.

17. A method of programming a three-dimensional nonvolatile memory device comprising a plurality of cell strings arranged perpendicular to a substrate, comprising:
identifying a selected word line and a plurality of unselected word lines connected to at least one of the cell stings; and
sequentially applying a negative voltage and a pass voltage to the selected word line and the unselected word lines, and then applying a program voltage to the selected word line while continuing to apply the pass voltage to the unselected word lines.

18. The method of claim 17, further comprising applying a turn-on voltage to string selection lines connected with string selection transistors of the cell strings while the negative voltage is applied to the selected word line and the unselected word lines.

19. The method of claim 18, further comprising applying a turn-off voltage to unselected string selection lines among the string selection lines while the pass voltage is applied to the selected word line and the unselected word lines.

20. The method of claim 18, further comprising applying a power supply voltage to bit lines connected to string selection transistors of the cell strings while the negative voltage is applied to the selected word line and the unselected word lines.

* * * * *